United States Patent
Mirichigni et al.

(10) Patent No.: US 8,184,487 B2
(45) Date of Patent: May 22, 2012

(54) MODIFIED READ OPERATION FOR NON-VOLATILE MEMORY

(75) Inventors: Graziano Mirichigni, Pietracamela (IT); Daniele Vimercati, Besana in Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/871,755

(22) Filed: Aug. 30, 2010

(65) Prior Publication Data

US 2012/0051150 A1 Mar. 1, 2012

(51) Int. Cl.
*G11C 7/10* (2006.01)

(52) U.S. Cl. .................. 365/189.04; 365/191; 365/203; 365/189.011

(58) Field of Classification Search ............. 365/189.04, 365/191, 203, 189.011
See application file for complete search history.

(56) References Cited

U.S. PATENT DOCUMENTS

| | | | |
|---|---|---|---|
| 7,406,576 B2 * | 7/2008 | Asauchi | 711/163 |
| 7,502,970 B2 * | 3/2009 | Aizawa | 714/42 |
| 7,594,055 B2 * | 9/2009 | Gower et al. | 710/305 |
| 7,793,192 B2 * | 9/2010 | Tamura et al. | 714/763 |

\* cited by examiner

*Primary Examiner* — Pho M Luu
(74) *Attorney, Agent, or Firm* — Berkeley Law & Technology Group, LLP

(57) ABSTRACT

A method may comprise executing a read operation to access a memory array by performing a preactive command to include a row-address-write operation and a bitline precharge and column selection operation and performing an activate command including a column-address-write operation and a row-decode-selection operation.

17 Claims, 6 Drawing Sheets

MODIFIED READ OPERATION FOR NON-VOLATILE MEMORY

BACKGROUND

1. Field

Subject matter disclosed herein relates to a read operation process for a nonvolatile memory.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, and phase-change memory, just to name a few examples. Volatile memory may generally be considered to have a shortcoming compared to nonvolatile memory in that volatile memory may not retain stored information if power to the volatile memory is interrupted. Despite such a possible disadvantage, volatile memory, such as SRAM or DRAM for example, is generally able to process program/read/erase operations faster than nonvolatile memory. Accordingly, volatile memory may be selected for use in electronic devices instead of nonvolatile memory if memory speed is a relatively important consideration. Thus, there is a general desire to improve speed of nonvolatile memory so that nonvolatile memory may become increasingly competitive with volatile memory.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
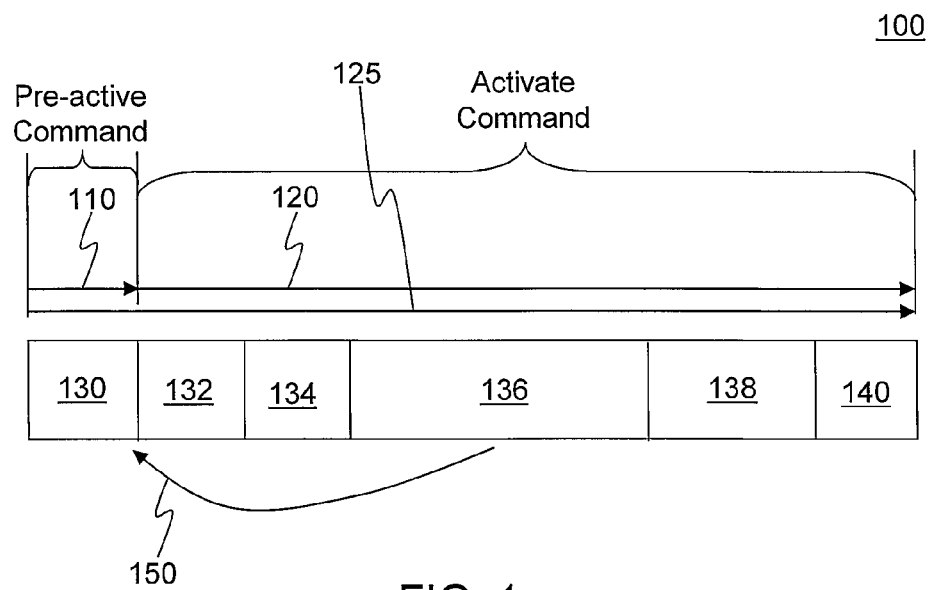
FIG. 1 is a timing diagram of a read access for a memory device, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include techniques to reduce memory access time for a nonvolatile memory device, such as phase change memory (PCM), for example. One such technique may involve modifying a standard read access by modifying a sequential order that particular portions of the standard read access are performed. For example, such particular portions may be performed in a preactive phase instead of an activate phase of the read access, as described in detail below. In an implementation, such a standard read access may be described in a number of publications, such as, for example, Joint Electron Devices Engineering Council (JEDEC) standard publication (see Low Power Double Data Rate 2 (LPDDR2), JESD209-2B, February, 2010, for example), known to one skilled in the art. Although other publications and/or standards may describe a standard read process, hereinafter, such a standard read process will be referred to as "LPDDR2 standard". Among other things, the LPDDR2 standard sets forth a number of commands associated with a memory device, such as a preactive command, an activate command, a read command, and a write command, just to name a few examples. Such commands are described in detail in the LPDDR2 standard, section 2.11.1, for example. In a particular implementation of a process to read from a memory device, a preactive command may include a process of writing at least a portion of a row address to a row address buffer. Subsequent to completion of the preactive command, an activate command may begin with a column address write process, a row-decode selection process, and a column-decode selection and bitline precharge process, for example. Upon completion of such an activate command, a memory controller may initiate a read command. In a particular implementation, the column-decode selection and bitline precharge process that occurs during the activate command, as specified by the JEDEC standard, may instead be performed during the preactive command. Since the column-decode selection and bitline precharge process comprises one of the most relevant contributors to the internal sensing time of a read access, such a rearrangement of process order may lead to a reduced memory access time, as described in further detail below. Although such a rearrangement may lead to an increased time to perform the preactive phase, the activate phase (having a shortened duration) may occur during a read access relatively more often than the preactive phase. Thus, a net reduction in a time to perform a read access may result from shortening the activate phase, even though the preactive phase is lengthened. For example, if multiple read access operations involve addresses to access a particular portion of a memory array (e.g., access is local to a particular group of rows), then a single preactive command may be applied to all such read access operations. Accordingly, duration of a read access may be shortened by shortening the time it takes to perform one or more activate commands included in the read access. Such may be the case even though the time it takes to perform a preactive command may increase in response to the shortened activate command, for example.

In an embodiment, a method of reducing memory access time for a read access of a nonvolatile memory device may include performing a preactive command to include a row address-write operation (e.g., per the LPDDR2 standard) and performing at least one operation otherwise assigned to an activate command (e.g., contrary to the LPDDR2 standard, which specifies the row address-write operation as the only operation performed during the preactive command). In other words, instead of performing a particular operation during the activate command phase according to the LPDDR2 standard, such a particular operation may instead be applied during the preactive command. In one implementation, such a particular operation may comprise a bitline precharge and column selection operation. Thus, contrary to the LPDDR2 standard, the activate command may occur subsequent to the bitline precharge and column selection operation. Such a rearrangement of operations for reading a memory device may be implemented by rearranging an order of address bits of an internal memory address of the memory device, and incorporating the internal memory address in a row address-write operation, as described below. Of course, such details of a read access are merely examples, and claimed subject matter is not so limited.

In an embodiment, a memory device having a reduced memory access time for read access may comprise a memory controller to execute read access to access a memory array. Such a memory controller may initiate a preactive command to perform a row address-write operation (e.g., per the LPDDR2 standard) and to perform at least one particular operation otherwise assigned to an activate command (e.g., contrary to the LPDDR2 standard). As mentioned above, the at least one particular operation may comprise a bitline precharge and column selection operation. In an implementation, a portion of a memory device may be adapted to rearrange an order of address bits of an internal memory address, and incorporate the internal memory address in a row address-write operation, as discussed below.

FIG. 1 is a timing diagram of a read access 100 for a memory device, according to an embodiment. For example, details of such a read access may be specified by the LPDDR2 standard mentioned above. In such a case, a beginning portion of a read access may include a preactive command followed by an activate command. Duration 110 may comprise a time-span from the beginning of the preactive command to the beginning of the activate command. Duration 120 may comprise a time-span from the beginning of the activate command to the beginning of a subsequent read command, as explained below. In particular, the preactive command may comprise a row address-write operation 130. Meanwhile, the activate command may comprise a number of operations leading to a read command. In particular, the activate command may comprise a column address-write operation 132, a row-decode selection 134, a bitline precharge and column selection operation 136, an amplification evaluation 138, and other internal memory operations 140. For example internal memory operations 140 may comprise, among other things, information transfer from sense amplifiers to row data buffers, described below. Arrow 150 represents an implementation wherein bitline precharge and column selection operation 136 is moved from the activate command to the preactive command, as discussed below. Of course, such a timing diagram is merely an example, and claimed subject matter is not limited in this respect.

Figure 2:
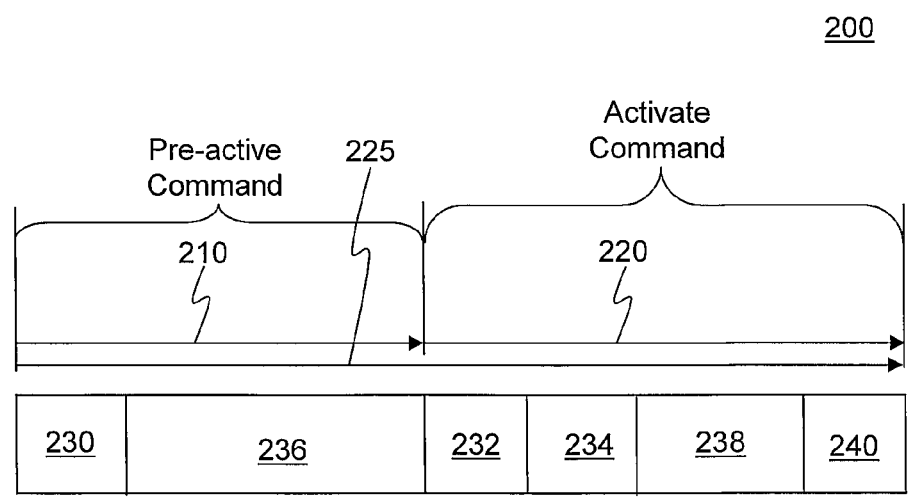
FIG. 2 is a timing diagram of a read access for a memory device, according to another embodiment.

FIG. 2 is a timing diagram of a read access 200 for a memory device, according to another embodiment. For example, details of portions of such a read access may be specified by the LPDDR2 standard mentioned above. However, as described in detail below, other portions of such a read access may be different from that specified by the LPDDR2 standard. As for read access 100, a beginning portion of a read access may include a preactive command followed by an activate command. Duration 210 may comprise a time-span from the beginning of the preactive command to the beginning of the activate command. Duration 220 may comprise a time-span from the beginning of the activate command to the beginning of a subsequent read command, as explained below. In particular, and in contrast to read access 100, the preactive command may comprise a row address-write operation 230 and a bitline precharge and column selection operation 236. Meanwhile, the activate command may comprise a reduced number (e.g., relative to the activate command in read access 100) of operations leading to a read command. In particular, the activate command may comprise a column address-write operation 232, a row-decode selection 234, an amplification evaluation 238, and other internal memory operations 240, for example. Though bitline precharge and column selection operation 236 has moved from the activate command to the preactive command in read access 200, a total duration of the preactive command plus the activate command may remain unchanged from read access 100. In other words, a duration 225, comprising the sum of durations 210 and 220, may remain unchanged from total duration 125 (FIG. 1), comprising the sum of durations 110 and 120. In detail, such a move of bitline precharge and column selection operation 236 has shortened the duration of the activate command (duration 220) while correspondingly lengthening the duration of the preactive command (duration 210). As discussed in detail below, a shortened activate command duration 220 may lead to reduced duration for a read access if, for example, the number of performed activate commands is greater than the number of performed preactive commands.

Figure 3:
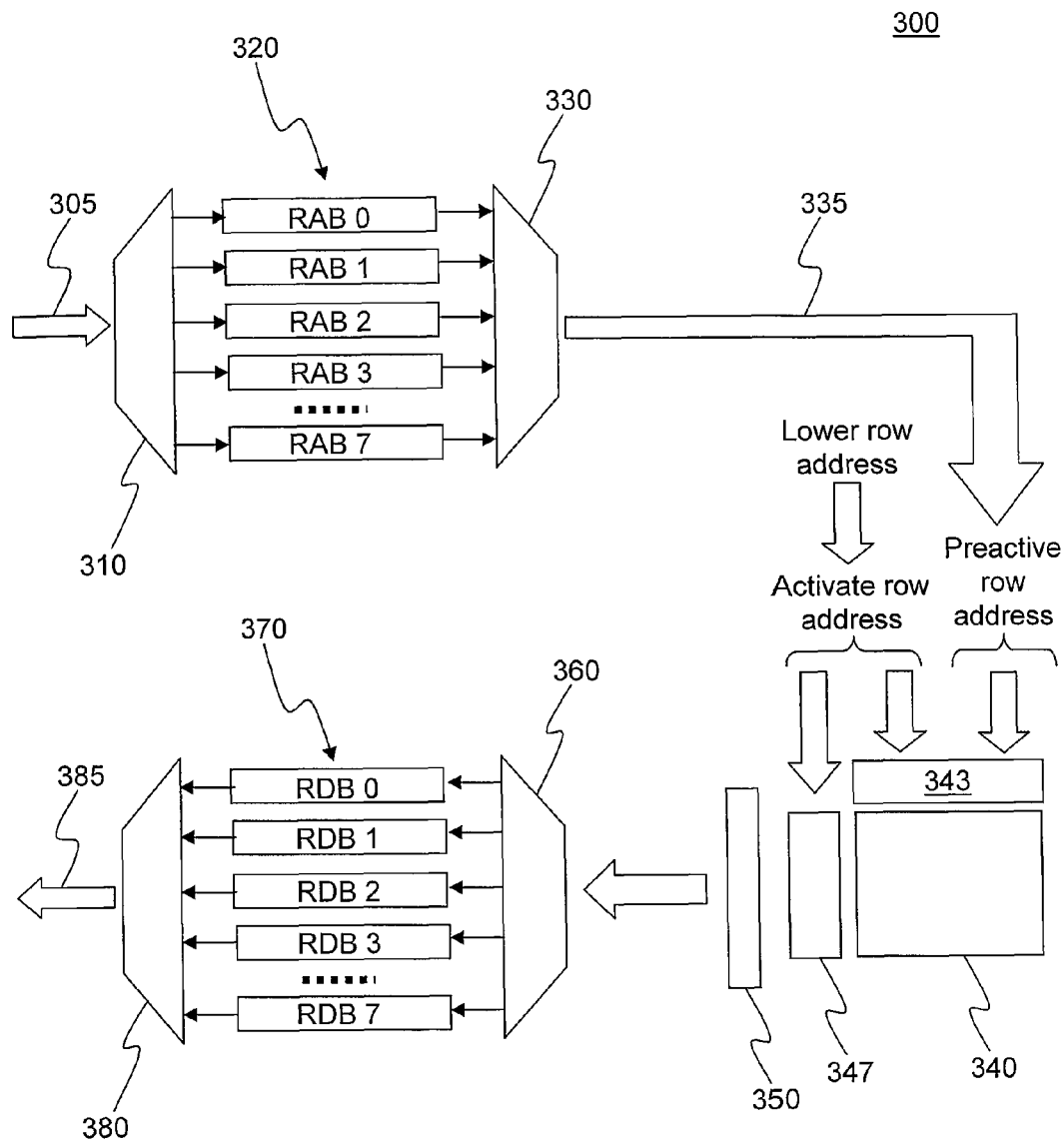
FIG. 3 is a schematic block diagram of a portion of a memory device, according to an embodiment.

FIG. 3 is a block diagram of a portion 300 of a memory device, according to an embodiment. For example, a LPDDR2 nonvolatile memory device may be accessed using three-phase addressing, including a preactive command, an activate command, and a read command. Such three-phase addressing is described in detail in the LPDDR2 standard, section 2.11.1, for example. During a preactive command, a portion of a row address may be stored in a particular location in a row address buffer 320 selected by selector 310 (e.g., a de-multiplexer). In an implementation, such a portion of a row address may comprise upper row address 305, which may include most-significant bits of a row address, for example. Row address buffer 320 may include multiple row address buffer (RAB) locations RAB 0 through RAB 7, though claimed subject matter is not so limited. During an activate command, a selector 330 may select a particular RAB to retrieve the upper portion 335 of the row address. Meanwhile, a lower part of the row address may be provided to the memory device and subsequently combined with the upper part of the row address to select a particular row of memory array 340. In particular, upper portion 335 of the row address may be provided to row-decoder 343 during the preactive command, while lower row address may be provided to column-decoder 347 during the activate command. Also during the activate command, the lower row address may be provided to row-decoder 343. As a result, particular one or more memory cells in memory array 340 corresponding to the row address may be read using sense amplifier 350. For example, the activate command may lead to a transfer of read memory content via sense amplifier 350 into a row data buffer 370 selected by selector 360. Row data buffer 370 may include multiple row data buffer (RDB) locations RDB 0 through RDB 7, though claimed subject matter is not so limited. In a particular example, individual RDB locations may comprise 32 Bytes. An {RAB, RDB} pair selected by selectors 310 and 380 may be referred to as a row buffer (RB). During a read command, selectors 360 and 380 may select a particular RDB, and the column address may be provided to the memory device to choose a starting address of a read burst, for example. The preactive command may be optional if an RAB already contains a desired partial row address. Similarly, the activate command may be optional if the desired RDB already contains desired memory content. Of course, such details of a portion of a memory device are merely examples, and claimed subject matter is not so limited.

Figure 4:
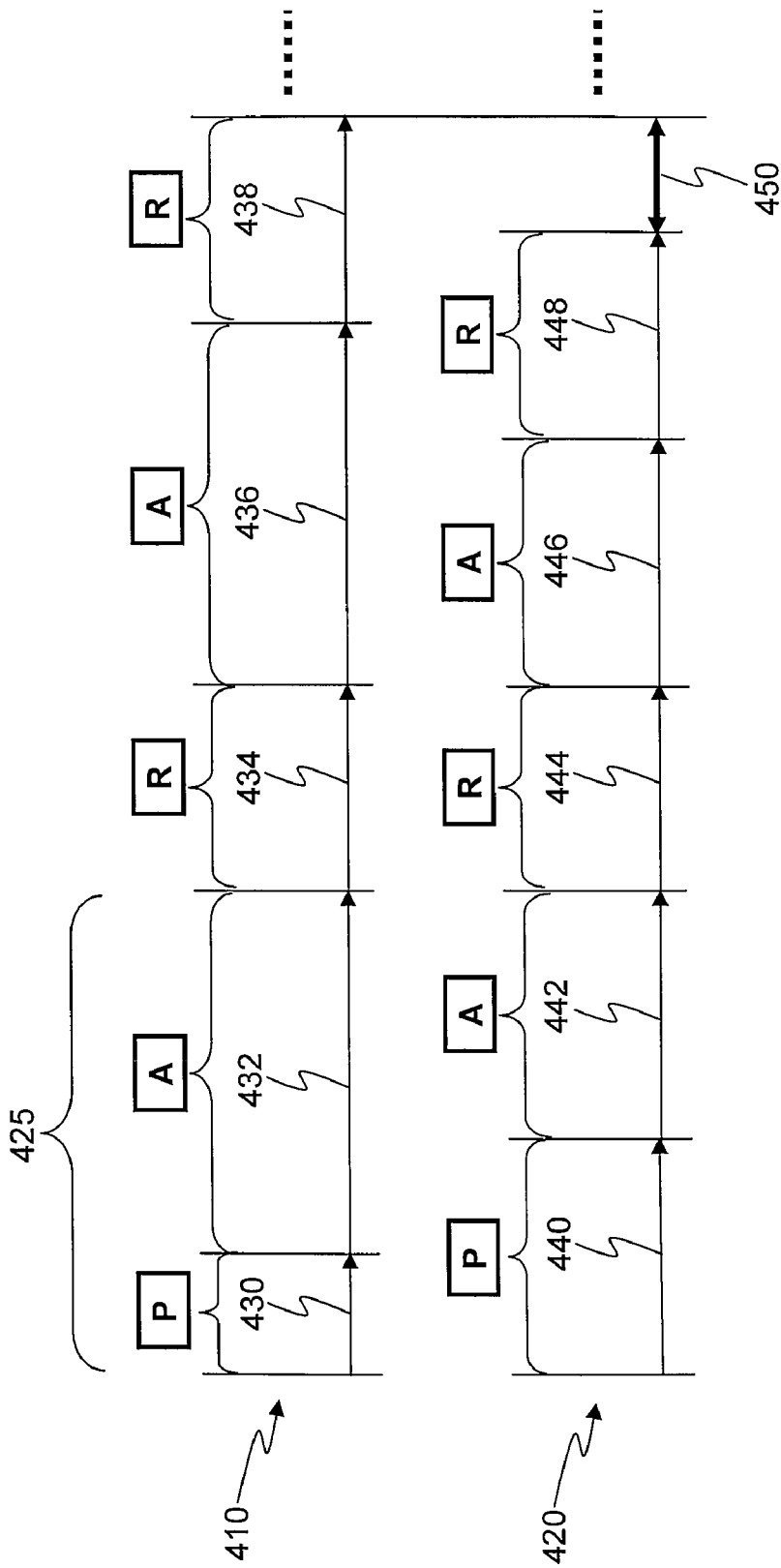
FIG. 4 shows timing diagrams of different read access operations for memory devices, according to an embodiment.

FIG. 4 shows timing diagrams comparing read access operations for memory devices, according to an embodiment. Such read access operations may comprise sequences of particular commands. For example, sequences 410 and 420 of respective read access operations may comprise (listed here in sequential order) a preactive command, an activate command, a read command, a second activate command, and a second read command. In FIG. 4, the block symbol with the letter "P" represents a preactive command, the block symbol with the letter "A" represents an activate command, and the block symbol with the letter "R" represents a read command. In an implementation, sequence 410 corresponds with the embodiment shown in FIG. 1, whereas sequence 420 corresponds with the embodiment shown in FIG. 2. In other words, preactive command 430 in sequence 410 does not include a bitline precharge and column selection operation that is instead included in the activate command 432. Such a case may be compliant with the LPDDR2 standard, for example. In contrast, preactive command 440 in sequence 420 does include a bitline precharge and column selection operation and is therefore not included in the activate command 442. Such a case is not compliant with at least some portions of the LPDDR2 standard, for example. As a result, a time-span of activate command 442 may be shorter than a time-span of activate command 432. As a trade-off, a time-span of preactive command 440 may be longer than a time-span of preactive command 430. In other words, read sequence 420 includes a shortened activate command at the expense of having a lengthened preactive command. However, if a read access includes a number of performed activate commands that are greater than a number of performed preactive commands, then such a read access may realize a benefit of a shortened total duration. In particular, sequence 420 includes one preactive command 440 and two activate commands 442 and 446, leading to a time reduction 450 compared to sequence 410. Here, sequence 110 also includes one preactive command 430 and two activate commands 432 and 436. But since relatively long activate commands in sequence 410 occur twice, sequence 410 may be longer than sequence 420, which has only one relatively long preactive command. A duration 425, comprising the sum of durations 430 and 432 in sequence 410 may remain the same in sequence 420, wherein duration 425 comprises the sum of durations 440 and 442. In other words, though a bitline precharge and column selection operation may have moved from the activate command to the preactive command in sequence 420, a total duration of the preactive command plus the activate command may remain unchanged from the case of sequence 410.

As just described, read access operations may include a number of activate commands that are greater than a number of preactive commands, as in sequence 410 and 420, for example. In other words, a preactive command need not occur for every memory access. Such may be the case, for example, if an upper portion of a row address is the same for multiple read access operations. For example, as discussed above, if multiple read access operations involve addresses to access a particular portion of a memory array (e.g., access is local to a particular group of rows), then a single preactive command may be applied to all such read access operations. Accordingly, duration of a read access may be shortened by shortening the time it takes to perform one or more activate commands included in the read access. Such may be the case even though the time it takes to perform a preactive command may increase in response to the shortened activate command, for example. Though not shown in FIG. 4, any number of read commands, activate commands, and preactive commands may occur subsequent to read commands 438 and 448 in read sequences 410 and 420, respectively. Of course, such details of read access operations are merely examples, and claimed subject matter is not limited in this respect.

Figure 5:
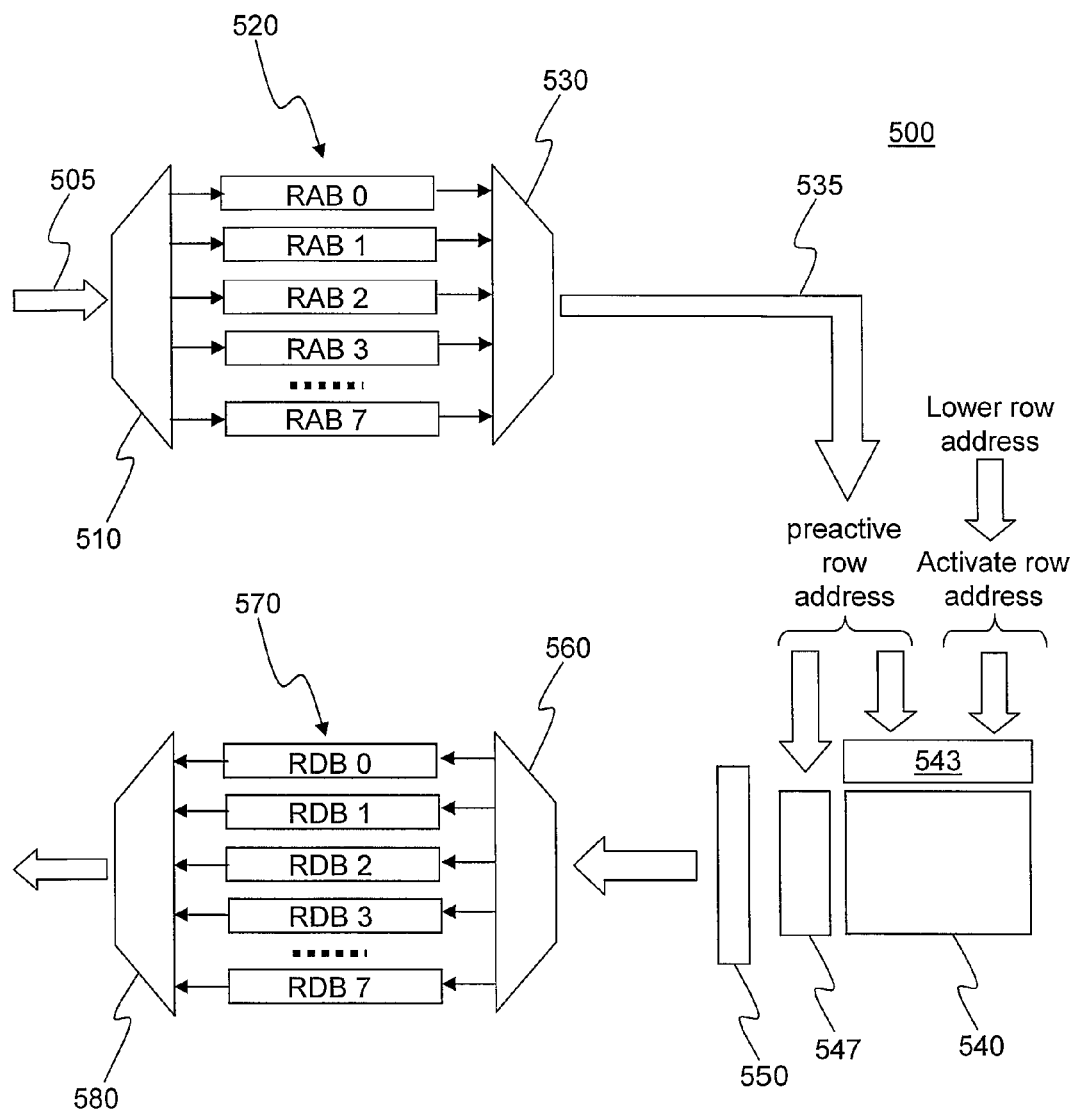
FIG. 5 is a schematic block diagram of a portion of a memory device, according to another embodiment.

FIG. 5 is a block diagram of a portion 500 of a memory device, according to another embodiment. Similar to the case shown in FIG. 3, for example, the memory device may comprise a LPDDR2 nonvolatile memory device, which may be accessed using three-phase addressing, including a preactive command, an activate command, and a read command. In contrast, however, to the case shown for FIG. 3, during a preactive command a row address may be stored in a particular location of a row address buffer 520 selected by a selector 510 (e.g., a multiplexer). In a particular implementation, such a location of a row address may comprise an upper row address 505, which may include most-significant bits of the row address, for example. Row address buffer 520 may include multiple row address buffer (RAB) locations RAB 0 through RAB 7, though claimed subject matter is not so limited. During an activate command, selector 530 may select a particular RAB to retrieve the upper portion 535 of the row address. Meanwhile, in contrast to the case shown in FIG. 3, the lower part of the row address may be provided to the memory device and combined with the upper part of the row address to select a particular row from memory array 540. In particular, upper portion 535 of the row address may be provided to column-decoder 547 during the preactive command, while lower row address may be provided to row-decoder 543 during the activate command. Also during the activate command, the upper row address may also be provided to row-decoder 543. As a result, particular one or more memory cells in memory array 540 corresponding to the row address may be read using sense amplifier 550. For example, the activate command may lead to transferring of read memory content via sense amplifier 550 into a row data buffer 570 selected by selector 560. Similar to the case for memory device portion 300, row data buffer 570 may include multiple row data buffer (RDB) portions RDB 0 through RDB 7, though claimed subject matter is not so limited. In an example, individual RDB portions may comprise 32 Bytes. An {RAB, RDB} pair selected by selectors 510 and 580 may be referred to as a row buffer (RB). During a read command, selectors 560 and 580 may select a particular RDB, and the column address may be provided to the memory device to choose a starting address of a read burst, for example. Similar to the case for memory device portion 300, the preactive command may be optional if a RAB already contains a desired partial row address. The activate command may be optional if a RDB already contains desired memory content. In one implementation, a time-span between preactive and activate commands, may have a minimum value equal to three clock cycles (e.g., about 7.5 ns for nonvolatile memory device DDR800), for example. A time-span between activate and read commands, may be about 80 ns for nonvolatile memory device DDR800, for example, though claimed subject matter is not so limited.

Figure 6:
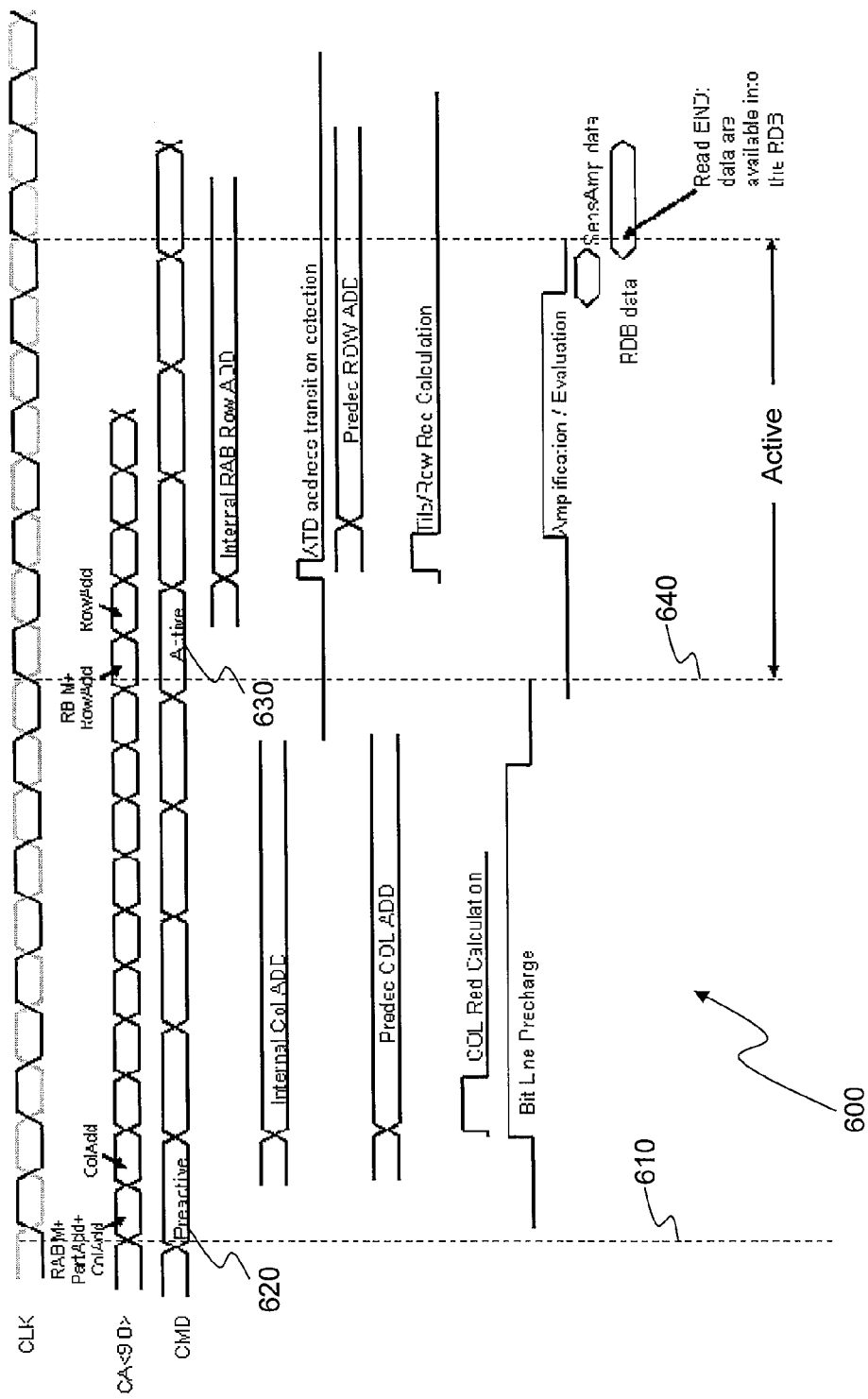
FIG. 6 is a timing diagram of a read access for a memory device, according to still another embodiment.

FIG. 6 is a timing diagram of a read access 600 for a memory device, according to a particular implementation of embodiments described above. Such a read access may be similar to read access 200 shown in FIG. 2, for example. At time 610, a memory controller (not shown) may initiate a preactive command 620 to begin read access 600. During such a preactive command period (e.g., from time 610 to time 640), operations predec COL ADD, COL redundancy calculations, and/or bitline precharge may be carried out. For example, the predec COL ADD operation may involve converting binary code to physical code. In contrast, such operations may be carried out during activate command 630 according the JEDEC standard. Of course, such details of a read access are merely examples, and claimed subject matter is not limited in this respect.

Figure 7:
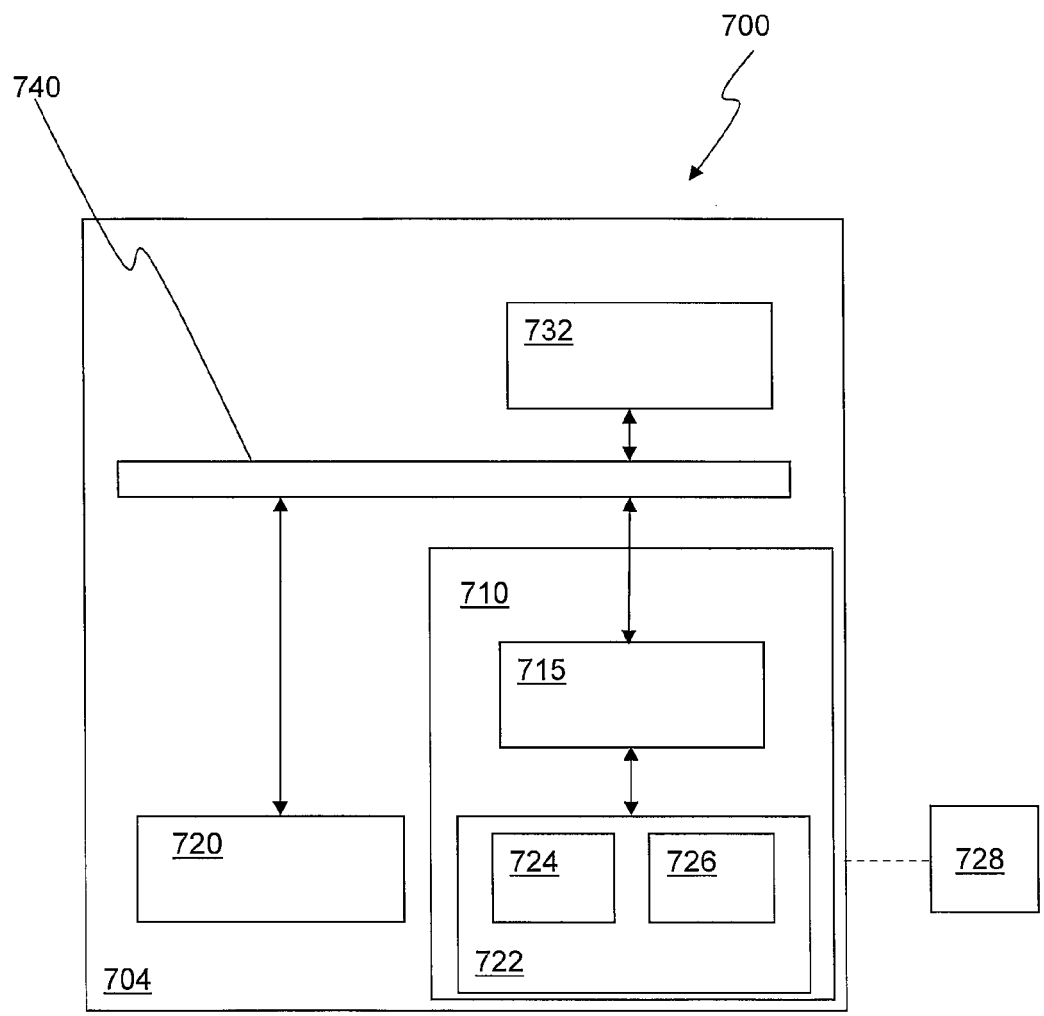
FIG. 7 is a schematic diagram of a computing system and a memory device, according to an embodiment.

FIG. 7 is a schematic diagram illustrating an exemplary embodiment of a computing system 700 including a memory device 710. A computing device 704 may be representative of any device, appliance, or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

In an embodiment, computing device 704 may include one or more processing units 720 operatively coupled to memory 722 through a bus 740 and a host or memory controller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may communicate with memory controller 715 to process memory-related operations, such as read, write, and/or erase. Processing unit 720 may include an operating system adapted to communicate with memory controller 715. Such an operating system may, for example, generate commands to be sent to memory controller 715 over bus 740. Such commands may include read/write instructions, for example.

Memory 722 is representative of any data storage mechanism. Memory 722 may include, for example, a primary memory 724 and/or a secondary memory 726. In a particular embodiment, memory 722 may comprise a main memory that includes at least a portion of persistent memory, as described above. Memory 722 may also comprise cache memory that may likewise include at least a portion of persistent memory. In particular, primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

According to an embodiment, one or more portions of memory 722 may store signals representative of data and/or information as expressed by a particular state of memory 722. For example, an electronic signal representative of data and/or information may be "stored" in a portion of memory 722 by affecting or changing the state of such portions of memory 722 to represent data and/or information as binary information (e.g., ones and zeros). As such, in a particular implementation, such a change of state of the portion of memory to store a signal representative of data and/or information constitutes a transformation of memory 722 to a different state or thing.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code, and/or instructions for one or more of the devices in system 700.

In one embodiment, system 700 may include a memory device comprising an array of memory cells, wherein the memory device further comprises a memory controller 715 to execute a read access to access the memory cells, and to initiate a preactive command to include a row address-write operation and at least one operation assigned to an activate command. System 700 may further include processor unit 720 to host one or more applications and to initiate a read command to memory controller 715 to provide access to the memory cells in the memory device.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   executing a read operation to access a memory array by:
   performing a preactive command to include a row-address-write operation and a bitline precharge and column selection operation; and
   performing an activate command including a column-address-write operation and a row-decode-selection operation, wherein said activate command is performed more than once per said preactive command.

2. The method of claim 1, wherein said activate command does not include said bitline precharge and column selection operation.

3. The method of claim 1, further comprising performing said activate command after said bitline precharge and column selection operation.

4. The method of claim 1, further comprising:
   rearranging an order of address bits of an internal memory address; and
   incorporating said internal memory address in said row address-write operation.

5. The method of claim 1, further comprising:
   providing a first memory address with said preactive command;
   incorporating said first memory address in a bitline precharge and column selection operation;
   providing a second memory address with said activate command; and
   incorporating said second memory address in a row selection operation.

6. The method of claim 1, wherein said memory array comprises a low power double data rate (LPDDR2) memory array.

7. A memory device comprising:
a memory controller to execute a read operation for accessing a memory array, said memory controller further being adapted to
perform a preactive command to include a row address-write operation and a bitline precharge and column selection operation; and
perform an activate command including a column-address-write operation and a row-decode-selection operation, wherein said activate command is performed more than once per said preactive command.

8. The memory device of claim 7, wherein said activate command does not include said bitline precharge and column selection operation.

9. The memory device of claim 7, said memory controller further adapted to perform said activate command after said bitline precharge and column selection operation.

10. The memory device of claim 7, said memory controller further adapted to:
rearrange an order of address bits of an internal memory address; and
incorporate said internal memory address in said row address-write operation.

11. The memory device of claim 7, said memory controller further adapted to:
provide a first memory address with said preactive command;
incorporate said first memory address in a bitline precharge and column selection operation;
provide a second memory address with said activate command; and
incorporate said second memory address in a row selection operation.

12. The memory device of claim 7, wherein said memory array comprises a low power double data rate (LPDDR2) memory array.

13. A system comprising:
a memory device comprising an array of memory cells, said memory device further comprising a memory controller to:
execute a read operation to access said memory cells;
perform a preactive command to include a row address-write operation and a bitline precharge and column selection operation; and
perform an activate command including a column-address-write operation and a row-decode-selection operation, wherein said activate command is performed more than once per said preactive command; and
a processor to host one or more applications and to initiate said read command to said memory controller to provide access to said memory cells in said memory device.

14. The system of claim 13, wherein said activate command does not include said bitline precharge and column selection operation.

15. The system of claim 13, wherein said memory controller is adapted to perform said activate command after said bitline precharge and column selection operation.

16. The system of claim 13, wherein said memory controller is adapted to:
rearrange an order of address bits of an internal memory address; and
incorporate said internal memory address in said row address-write operation.

17. The system of claim 13, wherein said memory controller is adapted to:
provide a first memory address with said preactive command;
incorporate said first memory address in a bitline precharge and column selection operation;
provide a second memory address with said activate command; and
incorporate said second memory address in a row selection operation.

* * * * *